( 12 ) United States Patent
Poiesz et al.

(10) Patent No.: US 11,086,234 B2
(45) Date of Patent: Aug. 10, 2021

(54) SUBSTRATE HOLDER AND A METHOD OF MANUFACTURING A DEVICE

(71) Applicant: ASML NETHERLANDS B.V., Veldhoven (NL)

(72) Inventors: Thomas Poiesz, Veldhoven (NL); Satish Achanta, Leuven (BE); Jeroen Bouwknegt, Tilburg (NL); Abraham Alexander Soethoudt, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/758,917

(22) PCT Filed: Oct. 11, 2018

(86) PCT No.: PCT/EP2018/077740
§ 371 (c)(1),
(2) Date: Apr. 24, 2020

(87) PCT Pub. No.: WO2019/191694
PCT Pub. Date: May 16, 2019

(65) Prior Publication Data
US 2020/0292947 A1 Sep. 17, 2020

(30) Foreign Application Priority Data
Nov. 8, 2017 (EP) .................................... 17200605

(51) Int. Cl.
G03B 27/58 (2006.01)
G03F 7/20 (2006.01)

(52) U.S. Cl.
CPC ................. *G03F 7/70716* (2013.01)

(58) Field of Classification Search
CPC .. G03F 7/707; G03F 7/70708; G03F 7/70716; G03F 7/70783; H01L 21/6831;
(Continued)

(56) References Cited

U.S. PATENT DOCUMENTS

2004/0117977 A1 6/2004 Hiramatsu et al.
2012/0212725 A1 8/2012 Lafarre et al.
(Continued)

FOREIGN PATENT DOCUMENTS

JP  2013042128  2/2013
JP  2013089956  5/2013
(Continued)

OTHER PUBLICATIONS

International Search Report and Written Opinion issued in corresponding PCT Patent Application No. PCT/EP2018/077740, dated Feb. 2, 2019.
(Continued)

*Primary Examiner* — Peter B Kim
(74) *Attorney, Agent, or Firm* — Pillsbury Winthrop Shaw Pittman LLP

(57) ABSTRACT

A substrate holder, a method of manufacturing of the substrate holder and a lithographic apparatus having the substrate holder. In one arrangement, a substrate holder is for use in a lithographic apparatus. The substrate holder is configured to support a lower surface of a substrate. The substrate holder has a main body, a plurality of burls and a coating. The main body has a substrate-facing face. The plurality of burls protrudes from the substrate-facing face. Each burl has a distal end configured to engage with the substrate. The distal ends are configured for supporting the substrate. The coating is on the substrate-facing face between the burls. Between the burls the substrate-facing face has an arrangement of areas. Adjacent areas are separated by a step-change in distance below the support plane. Each step-change is greater than a thickness of the coating.

20 Claims, 7 Drawing Sheets

(58) Field of Classification Search
CPC .......... H01L 21/6838; H01L 21/68735; H01L 21/6875; H01L 21/68757
See application file for complete search history.

(56) References Cited

U.S. PATENT DOCUMENTS

| | | |
|---|---|---|
| 2013/0094005 A1 | 4/2013 | Kunnen et al. |
| 2013/0094009 A1 | 4/2013 | Lafarre et al. |
| 2015/0029485 A1* | 1/2015 | Lafarre ............... B23K 26/342 355/72 |
| 2015/0103325 A1 | 4/2015 | Van Der Wilk et al. |
| 2016/0018744 A1 | 1/2016 | Lafarre et al. |
| 2016/0187791 A1 | 6/2016 | Houben et al. |
| 2016/0231655 A1 | 8/2016 | Lafarre et al. |
| 2016/0354864 A1 | 12/2016 | Hammer et al. |
| 2018/0190534 A1 | 7/2018 | Poiesz et al. |
| 2018/0259855 A1 | 9/2018 | Roset et al. |

FOREIGN PATENT DOCUMENTS

| | | |
|---|---|---|
| JP | 2016519332 | 6/2016 |
| JP | 2017120891 | 7/2017 |
| WO | 2013113568 | 8/2013 |
| WO | 201346452 | 11/2013 |
| WO | 201704894 | 2/2017 |
| WO | 2017071900 | 5/2017 |
| WO | 201721291 | 6/2017 |
| WO | 2018007498 | 1/2018 |
| WO | 2019091694 | 5/2019 |

OTHER PUBLICATIONS

Taiwanese Office Action issued in corresponding Taiwanese Patent Application No. 107139106, dated Jul. 14, 2020.
Japanese Office Action issued in corresponding Japanese Patent Application No. 2020-521601, dated Apr. 27, 2021.

* cited by examiner

SUBSTRATE HOLDER AND A METHOD OF MANUFACTURING A DEVICE

CROSS-REFERENCE TO RELATED APPLICATIONS

This application is the U.S. national phase entry of PCT patent application no. PCT/EP2018/077,740, which was filed on Oct. 11, 2018, which claims the benefit of priority of European patent application no. 17200605.8 which was filed on Nov. 8, 2017 and which is incorporated herein in its entirety by reference.

FIELD

The present invention relates to a substrate holder, a lithographic apparatus, a device manufacturing method and a method of manufacturing a substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The substrate is clamped onto a substrate holder in the lithographic apparatus when transferring a pattern from the patterning device. A substrate holder conventionally has a plurality of burls to support the substrate. The total area of the burls that contacts the substrate is small compared to the total area of a substrate. Therefore, the chance that a contaminant particle randomly located on the surface of the substrate or the substrate holder is trapped between a burl and the substrate is small.

A layer or coating can be provided on the substrate holder. Merely as an example, a layer or coating of diamond-like carbon (DLC) can be provided on the substrate holder. Such a coating can cause the substrate holder to deform. This may be due to internal stress within the coating. Deformation of the substrate holder can cause problems such as reducing the accuracy of focus.

SUMMARY

It is desirable, for example, to provide an improved substrate holder that can reduce the focus errors.

According to an aspect of the invention, there is provided a substrate holder for a lithographic apparatus, the substrate holder configured to support a lower surface of a substrate, wherein the substrate holder comprises:

a main body having a substrate-facing face;

a plurality of burls protruding from the substrate-facing face, each burl having a distal end configured to engage with the substrate, the distal ends substantially conforming to a support plane and being configured for supporting the substrate; and a coating on the substrate-facing face between the burls, the coating having a thickness;

wherein between the burls the substrate-facing face comprises an arrangement of areas, wherein adjacent areas are separated by a step-change in distance below the support plane, wherein each step-change is greater than the thickness of the coating.

According to an aspect of the invention, there is provided a substrate holder for a lithographic apparatus, the substrate holder configured to support a lower surface of a substrate, wherein the substrate holder comprises:

a main body having a substrate-facing face;

a plurality of burls protruding from the substrate-facing face, each burl having a distal end configured to engage with the substrate, the distal ends substantially conforming to a support plane and being configured for supporting the substrate; and a coating on the substrate-facing face between the burls;

wherein between the burls the substrate-facing face comprises an arrangement of areas, wherein adjacent areas are separated by a step-change in distance below the support plane, wherein adjacent areas are connected by side walls, and any coating on the side walls is insufficient to transfer stress between adjacent areas.

According to an aspect of the invention, there is provided a device manufacturing method using a lithographic apparatus, the method comprising:

projecting a beam patterned by a patterning device onto a substrate while holding the substrate on a substrate holder, wherein the substrate holder comprises:

a main body having a substrate-facing face;

a plurality of burls protruding from the substrate-facing face of the main body, each burl having a distal end configured to engage with the substrate, the distal ends substantially conforming to a support plane and being configured for supporting the substrate; and a coating on the substrate-facing face between the burls, the coating having a thickness;

wherein between the burls the substrate-facing face of the main body comprises an arrangement of areas, wherein adjacent areas are separated by a step-change in distance below the support plane, wherein each step-change is greater than the thickness of the coating.

According to an aspect of the invention, there is provided a device manufacturing method using a lithographic apparatus, the method comprising:

projecting a beam patterned by a patterning device onto a substrate while holding the substrate on a substrate holder, wherein the substrate holder comprises:

a main body having a substrate-facing face;

a plurality of burls protruding from the substrate-facing face of the main body, each burl having a distal end configured to engage with the substrate, the distal ends substantially conforming to a support plane and being configured for supporting the substrate; and a coating on the substrate-facing face between the burls;

wherein between the burls the substrate-facing face of the main body comprises an arrangement of areas, wherein adjacent areas are separated by a step-change in distance below the support plane, wherein adjacent areas are connected by side walls, and any coating on the side walls is insufficient to transfer stress between adjacent areas.

According to an aspect of the invention, there is provided a method of manufacturing a substrate holder for use in a lithographic apparatus, the method comprising:

providing a main body having a substrate-facing face;

forming a plurality of burls protruding from the substrate-facing face of the main body, each burl having a distal end configured to engage with the substrate, the distal ends substantially conforming to a support plane and being configured for supporting the substrate;

shaping the substrate-facing face such that between the burls the substrate-facing face of the main body comprises an arrangement of areas, wherein adjacent areas are separated by a step-change in distance below the support plane; and forming a coating on the substrate-facing face of the main body between the burls, the coating having a thickness, wherein each step-change is greater than the thickness of the coating.

According to an aspect of the invention, there is provided a method of manufacturing a substrate holder for use in a lithographic apparatus, the method comprising:

providing a main body having a substrate-facing face;

forming a plurality of burls protruding from the substrate-facing face of the main body, each burl having a distal end configured to engage with the substrate, the distal ends substantially conforming to a support plane and being configured for supporting the substrate;

shaping the substrate-facing face such that between the burls the substrate-facing face of the main body comprises an arrangement of areas, wherein adjacent areas are separated by a step-change in distance below the support plane; and forming a coating on the substrate-facing face of the main body between the burls, wherein adjacent areas are connected by side walls, and any coating on the side walls is insufficient to transfer stress between adjacent areas.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
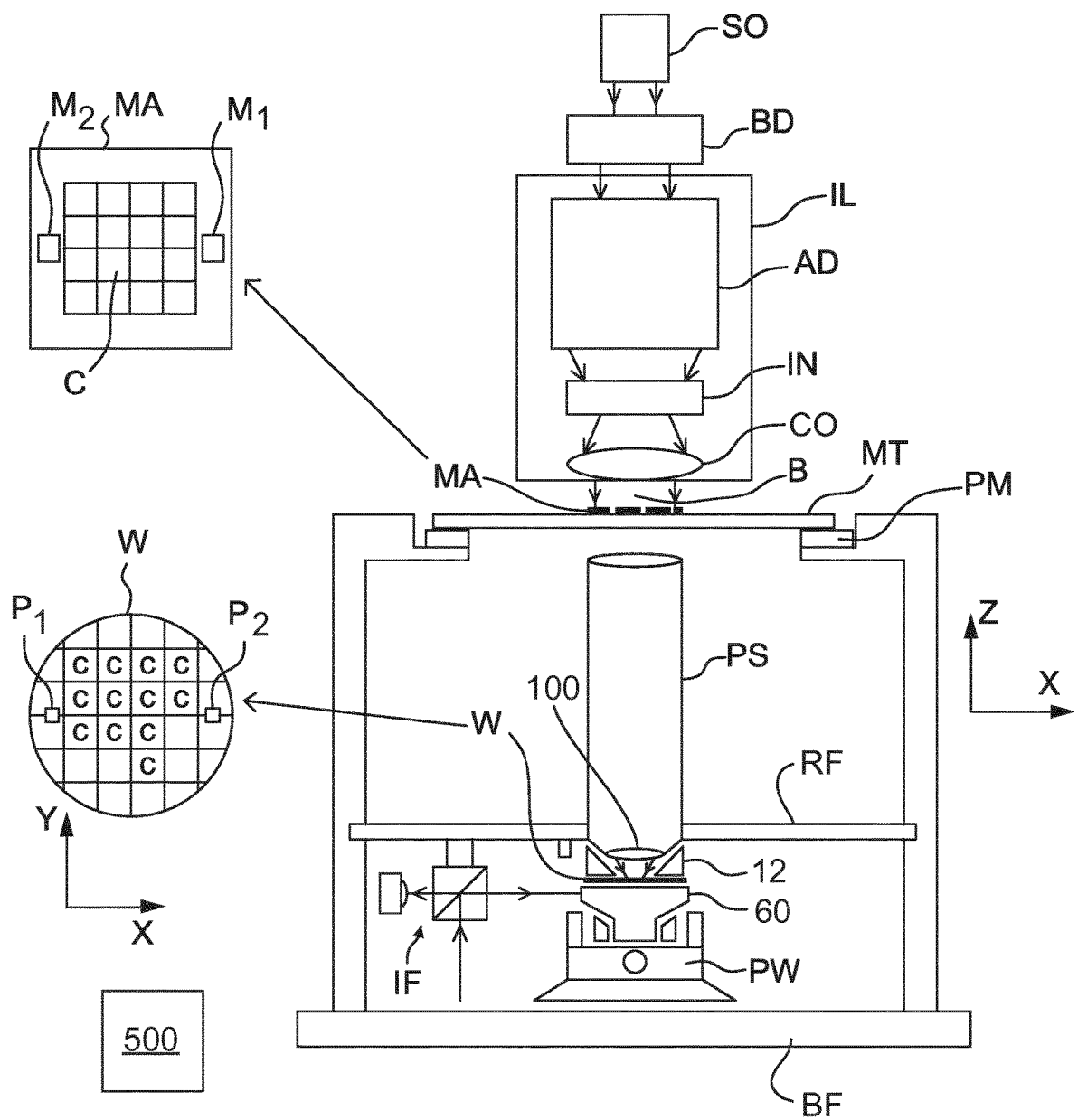
FIG. 1 schematically depicts a lithographic apparatus.

FIG. 1 schematically depicts a lithographic apparatus of an embodiment. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate support apparatus 60 constructed to hold a substrate (e.g. a resist-coated production substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables. The lithographic apparatus may be of a type that has a measurement station, at which there are various sensors for characterizing a production substrate prior to exposure and an exposure station, at which the exposures are commanded out.

The lithographic apparatus may be of a type wherein at least a portion of the substrate W may be covered by a immersion liquid having a relatively high refractive index, e.g. water such as ultra pure water (UPW), so as to fill an immersion space 11 between the projection system PS and the substrate W. An immersion liquid may also be applied to other spaces in the lithography apparatus, for example, between the patterning device MA and the projection system PS Immersion techniques can be used to increase the numerical aperture of projection systems. The term "immersion" as used herein does not mean that a structure, such as a substrate W, must be submerged in immersion liquid; rather "immersion" only means that an immersion liquid is located between the projection system PS and the substrate W during exposure. The path of the patterned radiation beam B from the projection system PS to the substrate W is entirely through immersion liquid. In an arrangement for providing immersion liquid between a final optical element of the projection system PS and the substrate W a liquid confinement structure 12 extends along at least a part of a boundary of an immersion space between the final optical element 100 of the projection system PS and the facing surface of the stage or table facing the projection system PS.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support apparatus 60 can be moved accurately, e.g. so as to position different target portions C in the path of the radiation beam B.

Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support apparatus 60 may be realized using a long-stroke module and a short-stroke module, which form part of the second positioner PW.

In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the patterning device alignment marks M1, M2 may be located between the dies.

The depicted apparatus could be used in at least one of the following modes:

1. In step mode, the support structure MT and the substrate support apparatus 60 are kept essentially stationary, while an entire pattern imparted to the radiation beam B is projected onto a target portion C at one time (i.e. a single static exposure). The substrate support apparatus 60 is then shifted in the X and/or Y direction so that a different target portion C can be exposed. In step mode, the maximum size of the exposure field limits the size of the target portion C imaged in a single static exposure.

2. In scan mode, the support structure MT and the substrate support apparatus 60 are scanned synchronously while a pattern imparted to the radiation beam B is projected onto a target portion C (i.e. a single dynamic exposure). The velocity and direction of the substrate support apparatus 60 relative to the support structure MT may be determined by the (de-) magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate support apparatus 60 is moved or scanned while a pattern imparted to the radiation beam B is projected onto a target portion C. In this mode, generally a pulsed radiation source is employed and the programmable patterning device is updated as required after each movement of the substrate support apparatus 60 or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

The substrate support apparatus 60 comprises a substrate holder WT. The substrate W is conventionally clamped to the substrate holder WT during exposures. Two clamping techniques are commonly used. In vacuum-clamping a pressure differential across the substrate W is established, e.g., by connecting the space between the substrate holder WT and the substrate W to an under-pressure that is lower than a higher pressure above the substrate W. The pressure difference gives rise to a force holding the substrate W to the substrate holder WT. In electrostatic clamping, electrostatic forces are used to exert a force between the substrate W and the substrate holder WT. Several different arrangements are known to achieve this. In one arrangement a first electrode is provide on the lower surface of the substrate W and a second electrode on the upper surface of the substrate holder WT. A potential difference is established between the first and second electrodes. In another arrangement two semi-circular electrodes are provided on the substrate holder WT and a conductive layer is provided on the substrate W. A potential difference is applied between the two semi-circular electrodes so that the two semi-circular electrodes and the conductive layer on the substrate W act like two capacitors in series.

A layer or coating can be provided on a substrate holder WT. For example, a layer or coating of diamond-like carbon (DLC) can be provided on the substrate holder WT. Other coatings can be provided on the substrate holder WT. The substrate holder WT can be provided with a layer of DLC to improve the interface properties between the substrate holder WT and the substrate W. A layer of DLC on the substrate holder WT reduces friction in directions parallel to the support plane SP of the substrate holder WT (and, therefore, parallel to the surface of the substrate W). The layer of DLC can reduce the coefficient of friction between the burls and the substrate W by a factor of about 2 compared to burls made of SiSiC. This allows the substrate W to fully relax when placed on the substrate holder WT. This reduces overlay errors. Coating a substrate holder WT with DLC has the additional advantage of increasing the lifetime of the substrate holder WT. The hardness and toughness of the layer of DLC reduce wear of the substrate holder WT when in physical contact with a substrate W.

The layer of DLC is one example of a layer of carbon based material that can be provided on a substrate holder WT to reduce friction (and thereby reduce overlay error) and/or to reduce wear of the substrate holder WT. Embodiments of the present invention will be described with specific reference to DLC. However, any other coating, for example a coating having a residual stress, may be used additionally or instead of DLC in alternative embodiments.

Such a coating may be a solid and/or inorganic carbon based material. The coating may have a higher resilience to wear than the main body of the substrate holder WT. The coating may comprise graphene. For example, the coating may comprise a material selected from the group consisting of: diamond-like carbon, graphene, graphite, tetrahedral amorphous carbon (ta-C), amorphous carbon (a-C), amorphous carbon with integrated tungsten (a-C:W), tetrahedral amorphous carbon with integrated tungsten (ta-C:W), hydrogenated amorphous carbon (a-C:H), tetrahedral hydrogenated amorphous carbon (ta-C:H), hydrogenated amorphous carbon with integrated tungsten (a-C:H:W), tetrahedral hydrogenated amorphous carbon with integrated tungsten (ta-C:H:W), hydrogenated amorphous carbon with silicon doping (a-C:H:Si), tetrahedral hydrogenated amorphous carbon with silicon doping (ta-C:H:Si), hydrogenated amorphous carbon with fluorine doping (a-C:H:F), tetrahedral hydrogenated amorphous carbon with fluorine doping (ta-C:H:F), ultra nanocrystalline diamond (UNCD), diamond, tungsten carbides, chromium carbides, titanium carbides, $Cr_2C/a$-C:H, graphite/TiC/Ti alloys, and multiwall carbon nanotubes (MWCNT) incorporated in alumina. Each of these carbon based materials demonstrates a high resilience to wear and low friction properties. In the embodiments described below, any one of these specific carbon based materials may be used instead of or in addition to DLC.

The inventors have identified that a layer of carbon based material, such as a layer of DLC, provided on a substrate holder WT gives rise to high internal compressive stresses.

These internal stresses are due to the production process and the material properties of carbon based materials such as DLC. The internal stresses in, for example, the layer of DLC can lead to deformation of the substrate holder WT. The deformation may comprise bending of the substrate holder WT, curling of the substrate holder WT, or other deformations. The inventors have performed measurements on a typical substrate holder WT coated with a 1 μm thick layer of DLC, and found a global peak-valley deformation of the order of 2.5 micrometers. This deformation can be partly suppressed by clamping the substrate W and substrate holder WT against the second positioner PW. However, an outer edge of the substrate holder WT may not be supported by the clamp system. Deformation of the outer edge of the substrate holder WT due to the internal stresses of the DLC layer can thus not be suppressed. In measurements on a typical substrate holder WT the inventors have found that this effect led to a 150 nm to 200 nm curl down of the outer edge. As a result, the outer edge may be out of the focus of the lithographic apparatus. One possibility to compensate for the global deformation of the substrate holder WT is to correct the flatness of the substrate holder WT after the layer of DLC has been applied. However, this approach requires extensive and expensive post-processing. Even if such post-processing was applied, the flatness requirement for many lithographic processes would not be met.

Figure 4:
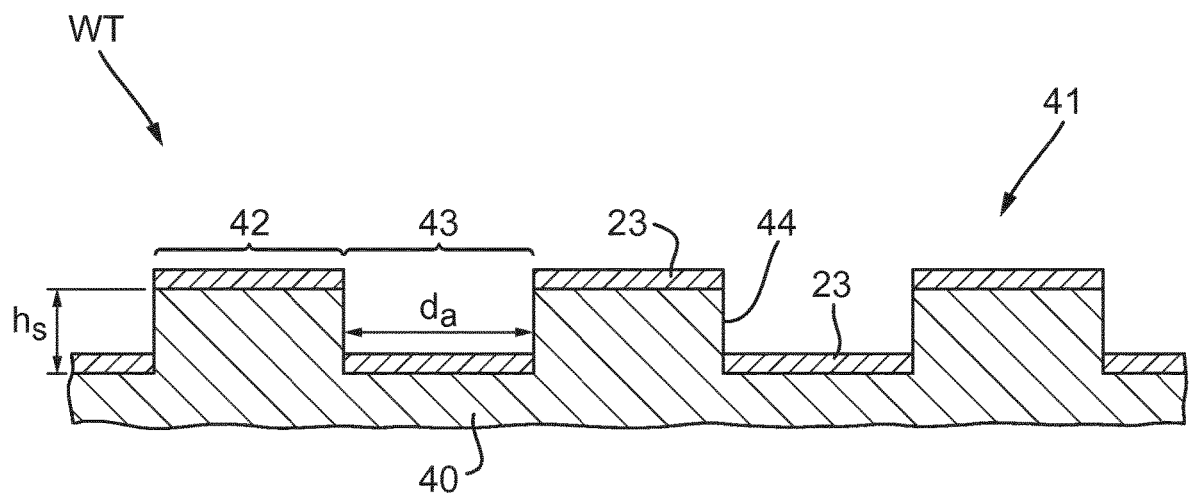
FIG. 4 depicts in cross-section adjacent areas of a substrate-facing face of a substrate holder according to an embodiment.

As depicted in FIG. 4, in an embodiment the substrate holder WT is configured to support a lower surface of a substrate W. The substrate holder WT comprises a main body 40. The main body 40 has a substrate-facing face 41.

In an embodiment the substrate holder WT comprises a plurality of burls 20 (e.g. see FIGS. 3, 6 and 7) protruding from the substrate-facing face 41. Each burl 20 has a distal end configured to engage with the substrate W. The distal ends substantially conform to a support plane SP and are configured for supporting the substrate W.

As depicted in FIG. 4, in an embodiment the substrate holder WT comprises a coating 23 on the substrate-facing face 41 between the burls 20. The coating 23 has a thickness $t_c$ (e.g. see FIGS. 3 and 5). In an embodiment, between the burls 20 the substrate-facing face 41 comprises an arrangement of areas 42, 43. As depicted in FIG. 4, in an embodiment adjacent areas 42, 43 are separated by a step-change in distance below the support plane SP.

The step-changes create a block structure in the substrate-facing face 41 of the main body. The coating 23 is on the substrate-facing face 41 that has the block structure. The step-changes relieve the internal stress of the coating 23. As a result, an embodiment of the invention is expected to reduce the deformation of the substrate holder WT.

Figure 12:
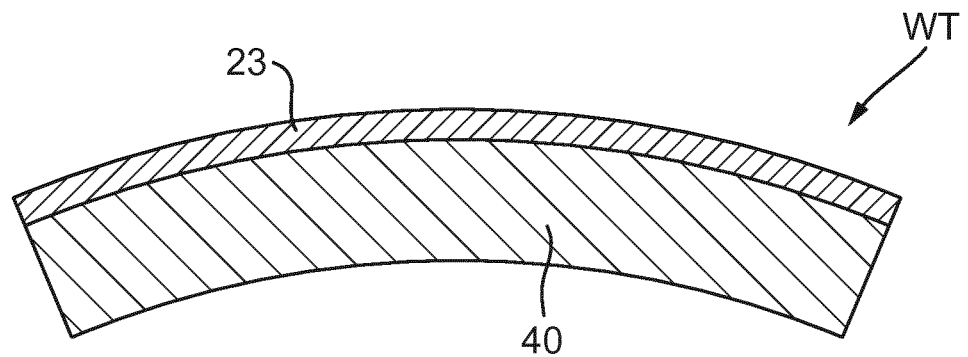
FIG. 12 depicts in cross-section deformation of a substrate holder.
Figure 13:
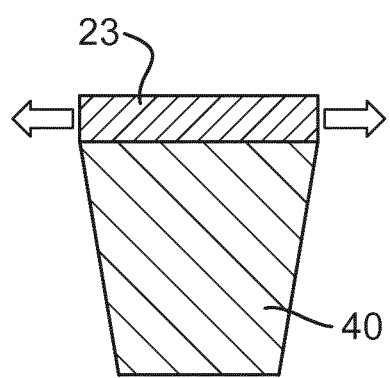
FIG. 13 depicts in cross-section deformation caused by a coating of a substrate holder according to an embodiment.

The residual internal stress of the coating 23 can cause the substrate holder WT to warp. For example, as shown in FIG. 12, the coating 23 can result in a global warp that causes a second order bowl shape in the substrate holder WT. The deformation of the substrate holder WT causes undesirable defocus issues, particularly at the edges of the substrate holder WT. FIG. 13 is a close-up showing the stress in the coating 23 causing bending of the substrate holder WT.

In an embodiment, each step-change (separating adjacent areas 42, 43) is greater than the thickness $t_c$ of the coating 23. As a result, the block structure has a higher amplitude than the coating thickness $t_c$. This means that the material of the main body 40 between the two levels of coating has room to decouple the local stress from the global warp.

In an embodiment, adjacent areas 42, 43 are connected by side walls 44 (see FIG. 4, for example). Any coating on the side walls 44 is insufficient to transfer stress between adjacent areas 42, 43. As a result, the step-changes decouple the local stresses in each area 42, 43 from each other, thereby reducing any warp of the substrate holder WT.

Figure 8:
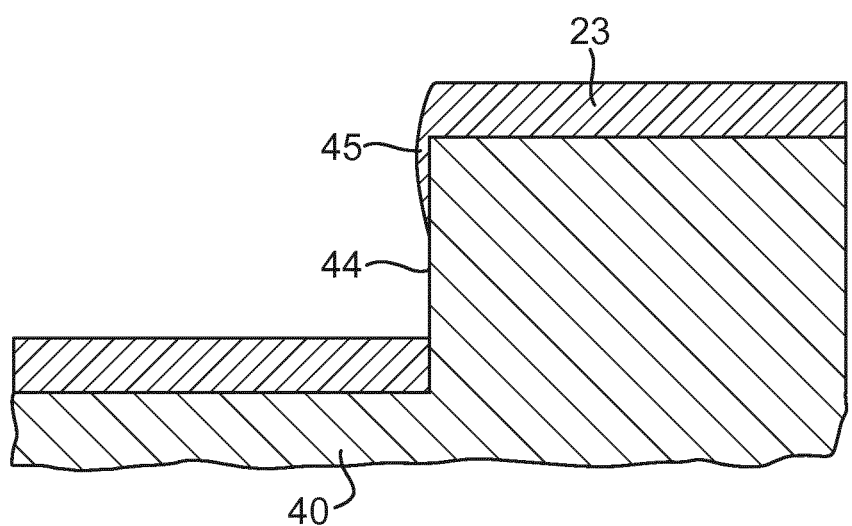
FIG. 8 depicts in cross-section coating on a side wall connecting adjacent areas of a substrate-facing face of a substrate holder.

FIG. 8 is a close-up cross-sectional view of two adjacent areas of the substrate-facing face of the main body 40. As shown in FIG. 8, the coating 23 is applied to each area. The two areas are at different levels, i.e. at different distances below the support plane SP.

The adjacent areas are connected by a side wall 44. In an embodiment, the coating 23 is applied to the substrate-facing face 41 from a direction substantially perpendicular to the substrate-facing face 41. The process of applying the coating is a line-of-sight process. As a result, there will be substantially no coating applied to the side walls 44.

As shown in FIG. 8, it is possible for a thin layer 45 of the coating material to be applied to the side walls 44. The thin layer 45 is much thinner than the thickness $t_c$ of the coating 23 on each area. For example, the thin layer 45 may have a thickness of 1 nm to 10 nm.

As depicted in FIG. 8, the thin layer 45 of coating material on the sidewall 44 may not connect the coating 23 in the two adjacent areas. Even if the thin layer 45 of coating material connects the coating 23 between the two adjacent areas, the internal stress of the coating 23 cannot be transferred between the areas 42, 43. In an embodiment, any coating on the side walls 44 is insufficient to transfer stress between adjacent areas 42, 43. As a result, the step-change relieves the stress of the coating 23.

Figure 5:
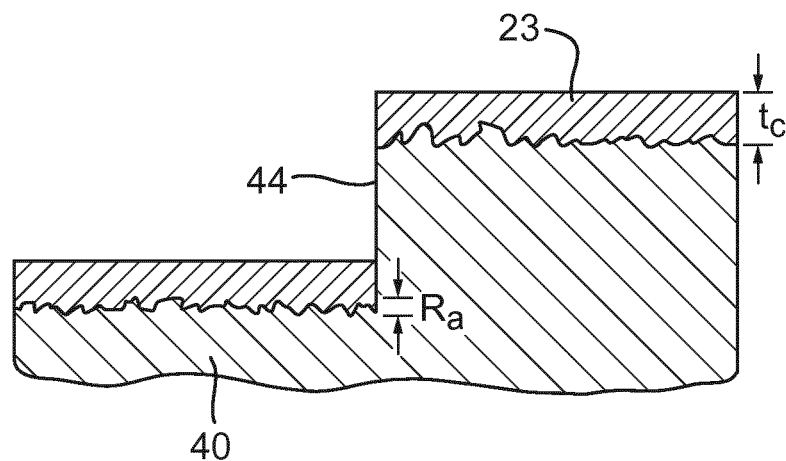
FIG. 5 depicts in cross-section two adjacent areas of a substrate-facing face of a substrate holder according to an embodiment.

FIG. 5 is a close-up in cross-section of two adjacent areas 42, 43 of the substrate-facing surface 41 of the substrate table WT. As shown in FIG. 5, the substrate-facing face 41 may have a roughness $R_a$. As shown in FIG. 5, in an embodiment the thickness $t_c$ of the coating 23 is greater than the roughness $R_a$ of the substrate-facing face 41 before the coating 23 is applied.

There is a benefit to having the coating 23 of at least a certain thickness $t_c$. When the thickness $t_c$ of the coating 23 is greater than the roughness $R_a$, then the coating 23 can act as a continuous layer. Without the step-changes between the adjacent areas 42, 43, the continuous layer of coating 23 can push the top surface of the substrate holder WT apart. This creates a global warp because the stress is nowhere relieved.

Hence, the provision of the step-changes is particularly beneficial when the coating 23 has a thickness $t_c$ greater than the surface roughness $R_a$ of the substrate-facing face 41 of the substrate holder WT.

The surface roughness $R_a$ is the arithmetic average value of a roughness profile determined from deviations about the centre line within an evaluation length. In an embodiment, the surface roughness $R_a$ is less than about 500 nm, optionally less than about 300 nm, optionally less than about 100 nm, or optionally less than about 50 nm.

It has been found that when the surface roughness $R_a$ is greater than the thickness $t_c$ of the coating 23, then the warp of the substrate holder WT may be less. This is because the surface roughness can relieve the stress in the coating 23. However, when the surface roughness $R_a$ is greater than the thickness $t_c$ of the coating 23, then the coating 23 may not be as effective. The present invention is expected to achieve the advantages of a thicker coating 23 together with a reduced warp of the substrate holder WT. This is achieved by relieving the internal stress of the coating 23 by the step-changes instead of by the surface roughness.

As depicted in FIGS. 5 and 8, in an embodiment the coating 23 is discontinuous between adjacent areas 42, 43. It is possible that the coating 23 may be continuous between adjacent areas 42, 43. For example, if the thin layer 45 of coating material on the side walls 44 extends along the full height of the side wall 44, then there may be a continuous coating 23 between the adjacent areas 42, 43. However, in this case the thin layer 45 of coating material would be so thin that stress is not transferred between the adjacent areas 42, 43.

In an embodiment, each step-change is greater than the thickness $t_c$ of the coating 23 by a factor of at least two, optionally at least four, and optionally at least eight. In an embodiment, each step-change is at least 1 µm. Optionally, each step-change is at least 2 µm, and optionally at least 3 µm. This allows the step-changes to be greater than the thickness $t_c$ of the coating 23.

Figure 7:
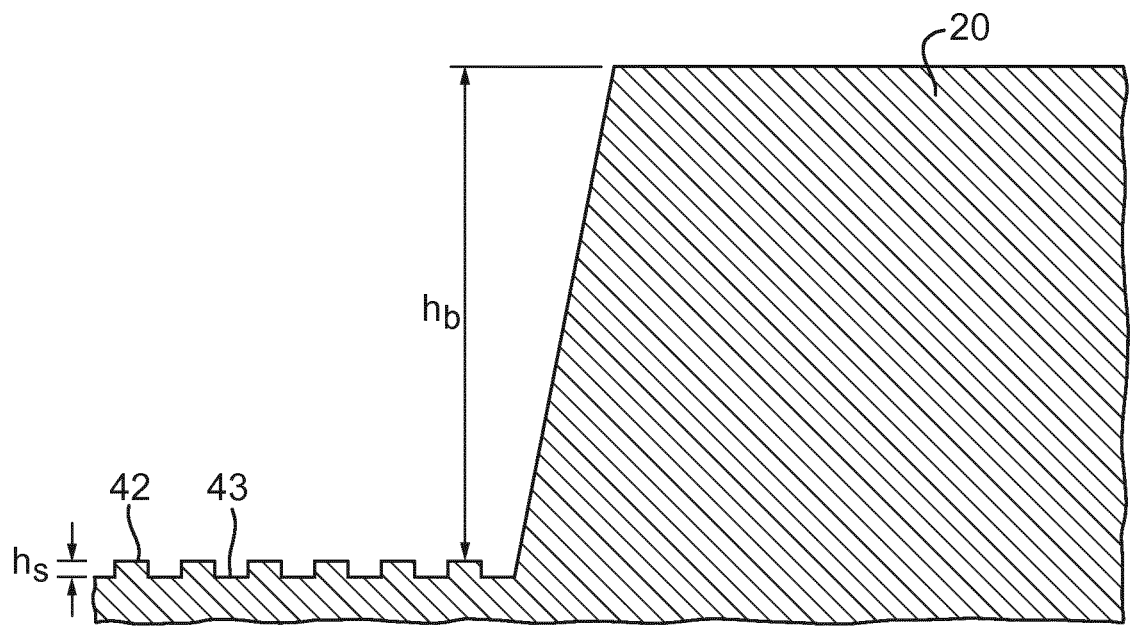
FIG. 7 depicts in cross-section an arrangement of areas and a burl of a substrate holder according to an embodiment.

However, the step-changes are much less than the height $h_b$ of the burls 20. FIG. 7 schematically depicts in cross-section the step-changes in relation to the height $h_b$ of the burls 20. The step-change $h_s$ is much less than the height $h_b$ of the burls 20. In an embodiment the height $h_b$ of the burls 20 is at least 10 times, optionally at least 20 times, and optionally at least 50 times the step-change $h_s$. In an embodiment each step-change $h_s$ is at most 10 µm, optionally at most 5 µm, optionally at most 4 µm, and optionally at most 3 µm.

In an embodiment, the areas 42, 43 have a lateral dimension less than that of the burls 20. In an embodiment, the diameter (i.e. lateral dimension) of the distal end surface of the burls 20 may be in the range of from about 25 µm to about 1000 µm, and optionally 100 µm to 300 µm, e.g. about 200 µm. The areas 42, 43 separated by the step-changes $h_s$ are smaller.

Figure 6:
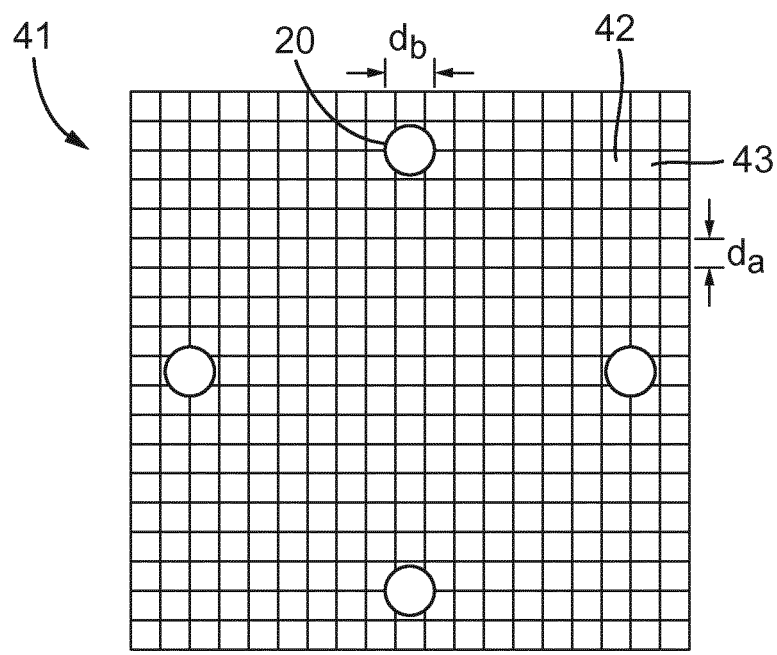
FIG. 6 depicts in plan an arrangement of areas of a substrate-facing face of a substrate holder according to an embodiment.

In the embodiments shown in FIG. 6, the areas 42, 43 have a square shape. In the case of a square shape, the lateral dimension corresponds to the length of each side of the square shape. However, it is not necessary for the areas 42, 43 to have a square shape. Other shapes are also possible.

Figure 9:
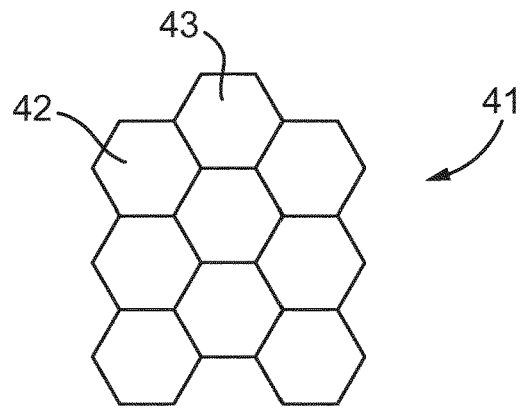
FIG. 9 depicts in plan an arrangement of areas according to an embodiment.
Figure 10:
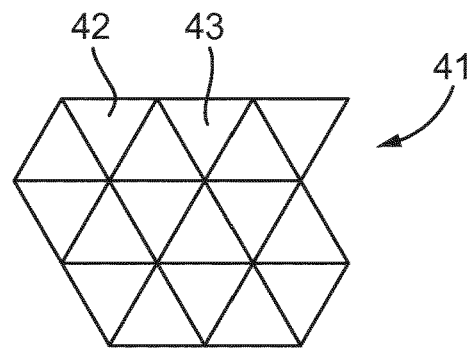
FIG. 10 depicts in plan an arrangement of areas according to an alternative embodiment.
Figure 11:
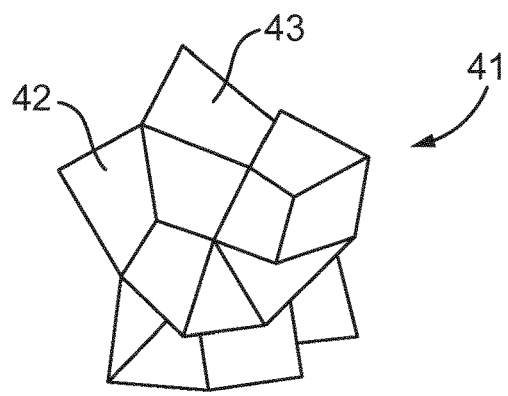
FIG. 11 depicts in plan an arrangement of areas according to an alternative embodiment.

FIGS. 9 to 11 depict possibilities for the arrangement of areas 42, 43 in plan. FIG. 9 shows an arrangement in which each of the areas 42, 43 has a hexagonal shape. In the case of a hexagonal shape, the lateral dimension is the distance from the middle of one edge to the middle of the opposite edge (i.e. passing through the centre of the hexagon). FIG. 10 shows an arrangement of areas 42, 43 on the substrate-facing face 41. In the embodiments shown in FIG. 10, each area 42, 43 is an equilateral triangle. In the case of an equilateral triangle, the lateral dimension is the distance from one vertex to the middle of the opposite edge (i.e. passing through the centre of the triangle).

FIG. 11 shows an alternative arrangement of the areas 42, 43 on the substrate-facing face 41 of the substrate holder WT. In the embodiment shown in FIG. 11, the areas 42, 43 do not have a regular shape. Instead, the arrangement is irregular and resembles crazy paving. The lateral dimension is a distance between two edges of the area passing through the centre (i.e. the centroid) of the area. The centroid of the area is the arithmetic mean position of all the points in the shape of the area.

In an embodiment, the maximum lateral dimension that passes through the centroid of the area is less than the diameter of the distal end surface of the burls 20. In an embodiment, the areas 42, 43 have a lateral dimension of at most 100 µm, optionally at most 50 µm, and optionally at most 20 µm. In an embodiment, the areas 42, 43 have a maximum lateral dimension (that passes through the centroid) of at most 100 µm, optionally at most 50 µm, and optionally at most 20 µm.

By providing a maximum size for the areas 42, 43, it is possible to ensure that the internal stress of the coating 23 is sufficiently relieved to reduce the deformation of the substrate holder WT.

FIG. 6 depicts in plan view the substrate-facing face 41 of the substrate holder WT according to an embodiment of the invention. As shown in FIG. 6, the areas 42, 43 have a lateral dimension $d_a$ that is smaller than the diameter $d_b$ of the burls 20.

As depicted in FIG. 6, the arrangement of areas 42, 43 fills substantially all of the substrate-facing face 41 between the burls 20. In an embodiment, substantially all of the substrate-facing face 41 between the burls 20 comprises the arrangement of areas 42, 43. However, it is not necessary for the entirety of the substrate-facing face 41 between the burls 20 to be formed to have the arrangement of areas 42, 43. In an embodiment most of the substrate-facing face 41 is formed to have the arrangement of areas 42, 43.

As depicted in FIG. 6, in an embodiment the distal end surfaces of the burls 20 are not formed to have the arrangement of areas 42, 43. In an embodiment, substantially the whole of the distal end surface of the burls 20 is at the supporting plane SP. The distal end surfaces of the burls 20 are not formed to have any step-changes.

In an embodiment, the coating 23 is applied to the distal end surfaces of the burls 20 (in addition to the substrate-facing face 41 of the substrate holder WT). As a result, it is possible for the coating 23 on the distal end surfaces of the burls 20 to cause some deformation of the substrate holder WT. In an embodiment the total area of the distal end surfaces of all the burls 20 is in the range of from 1% to 3% of the total area of a substrate W or the substrate holder WT. This limits the extent to which the residual stress in the coating 23 on the burls 20 can deform the substrate holder WT.

The limited size of each of the burls 20 (i.e. the diameter $d_b$) allows the stress relief for the coating 23. This is because the coating 23 on one burl 20 cannot transfer stress to the coating 23 on another burl 20. The arrangement of areas 42, 43 provides an improved stress relief for the substrate-facing face 41 between the burls 20. This is because the lateral dimension $d_a$ of the areas 42, 43 is smaller than the diameter $d_b$ of the burls 20.

In an alternative embodiment, the arrangement of areas 42, 43 with step-changes between them is applied to the distal end surfaces of the burls 20. This may provide room for a contaminant particle randomly located on the distal end surface to remain without affecting the flatness of the substrate W. An embodiment of the invention is expected to increase the lifetime of a substrate load grid.

In an embodiment, the arrangement of areas 42, 43 with step-changes between them is applied to the backside of the substrate W where a coating (e.g. a coating to prevent dopant from escaping at high temperatures) may be applied.

In an embodiment, each step-change $h_s$ is less than a minimum distance between the substrate-facing face 41 of the main body 40 and the support plane SP. As depicted in FIG. 7, the minimum distance between the substrate-facing face 41 and the support plane SP is denoted by $h_{b'}$. The step-change $h_s$ is much less than this minimum distance $h_{b'}$.

In an embodiment, each step-change $h_s$ is at most 20 µm, optionally at most 10 µm, optionally at most 5 µm, and optionally at most 2 µm.

In an embodiment, each area 42, 43 has a lateral dimension $d_a$ greater than the step-changes $h_s$ that separate the area 42 from adjacent areas 43. As depicted in FIGS. 4 and 7, the substrate-facing face 41 has a block structure. The blocks of some areas 42 protrude closer to the support plane SP than the blocks of other areas 43. The further protruding areas 42 are formed to have an aspect ratio such that they are wider than they are high (relative to the surrounding areas 43). This improves stability for the blocks that form the areas 42, 43. In an embodiment, each area 42 has a lateral dimension $d_a$ that is at least twice as great as the step-changes $h_s$ that separate the area 42 from adjacent areas 43.

As depicted in FIGS. 4, 5, 7 and 8, in an embodiment adjacent areas 42, 43 are connected by side walls 44. The side walls 44 extend substantially perpendicularly to the support plane SP. The perpendicular side walls 44 form the step-changes in height between the areas 42, 43. In an embodiment, the side walls 44 form right angles with the substrate-facing parts of the areas 42, 43.

It is not essential for the side walls 44 to be exactly perpendicular to the support plane SP. The side walls 44 may be formed such that there is a slight overhang or a slight frustro-conical shape. The side walls 44 are shaped such that the coating 23 (which is applied from a direction substantially perpendicular to the support plane SP) cannot transfer stress between the areas 42, 43. Hence, there may be a small amount of the coating material on the side wall 44, as depicted in FIG. 8, for example.

It is possible that the side wall 44 may form a slightly rounded corner with the substrate-facing parts of the areas 42, 43. In particular, as depicted in FIG. 5, the substrate-facing parts of the areas 42, 43 may have a surface roughness. The surface roughness may cause there to be an angle other than 90 degrees with the sidewall 44. In an embodiment, the step-change $h_s$ is at least 5 times, and optionally at least 10 times and optionally at least 20 times the surface roughness $R_a$. As a result, the step-change $h_s$ provides a discontinuity in the coating 23 between the areas 42, 43.

In an embodiment, the arrangement applies to most of the substrate holder WT in plan view.

As depicted in FIGS. 6, 9 and 10, in an embodiment the arrangement of areas 42, 43 is a grid. In an embodiment the grid is a regular grid of regular shapes. This makes it easier to manufacture the substrate holder WT to have the arrangement of areas 42, 43. However, it is not essential for the arrangement to be a regular grid, for example, as shown in FIG. 11, in an embodiment the arrangement is not a grid. Nevertheless, the arrangement of areas 42, 43 provides stress relief for the coating 23 applied to the areas 42, 43.

As depicted in FIGS. 4, 5, 7 and 8, in an embodiment the arrangement is configured such that there are two different levels for the substrate-facing face 41. In other words, there are two different heights of the substrate-facing face 41 below the support plane SP. Each area 42, 43 is arranged to be at one of only two different distances below the support plane SP. However, it is not necessary for the number of levels to be limited to only two.

In an embodiment the arrangement of areas is configured such that there are three, four, or more levels of the substrate-facing face 41 below the support plane SP. Each area 42, 43 is arranged to be at one of only three, four or more different distances below the support plane SP. For example, in the arrangement shown in FIG. 9, the arrangement is a hexagonal grid. In this case, it is necessary for there to be at least three levels in order for all adjacent areas 42, 43 to have a step-change between them. In particular, the hexagonal grid requires there to be least three levels. Meanwhile, the triangular grid shown in FIG. 10 or the square grid shown in FIG. 6 can be formed with only two different levels.

In an embodiment, the arrangement of areas 42, 43 is formed by laser ablation. In an embodiment, a laser beam is used to irradiate the upper surface of the substrate holder WT so as to form the step-changes.

Figure 2:
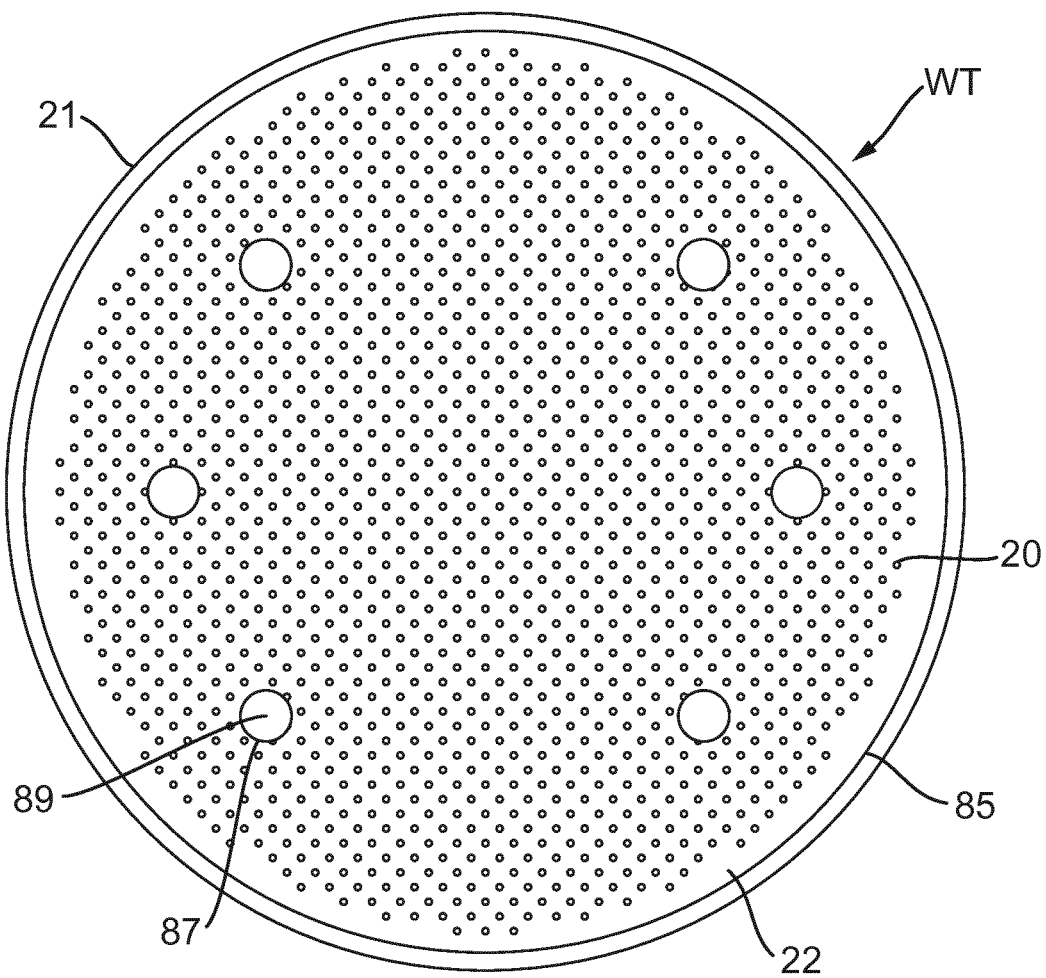
FIG. 2 depicts in plan a substrate holder according to an embodiment.

FIG. 2 depicts further features of substrate holder WT for use in a lithographic apparatus according to an embodiment. The substrate holder WT supports a substrate W. The substrate holder WT comprises a main body 40. The main body 40 has a main body surface 22. The burls 20 are provided projecting from the main body surface 22. The distal end surface of each burl 20 engages with the substrate W. Main body 40 and burls 20 may be formed of SiSiC, a ceramic material having silicon carbide (SiC) grains in a silicon matrix. Alternatively, main body 40 and burls 20 may be formed of SiC.

A plurality of through-holes 89 may be formed in the main body 40. Through-holes 89 allow the e-pins to project through the substrate holder WT to receive the substrate W. Through-holes 89 may allow the space between a substrate W and the substrate holder WT to be evacuated. Evacuation of the space between a substrate W and the substrate holder WT can provide a clamping force, if the space above the substrate W is not also evacuated. The clamping force holds the substrate W in place. If the space above the substrate W is also evacuated, as would be the case in a lithographic apparatus using EUV radiation, electrodes can be provided on the substrate holder WT to form an electrostatic clamp.

In an embodiment, the substrate holder WT further comprises a seal 87. The seal 87 may project from the main body surface 22. The seal 87 may have a seal end surface. The seal 87 may surround a through-hole 89. The seal end surface may form a continuous ring around the through-hole 89. In other embodiments, the seal 87 may have any other shape that surrounds the through-hole 89. The height of the seal 87 may be substantially equal to the height of the burls 20, such that the seal end surface conforms to the substantially flat support plane defined by the distal end surfaces of the burls 20. The seal 87 may contact the substrate W when the substrate W rests on the burls 20 of the substrate holder WT. A seal 87 may contact the substrate W such that fluid communication between a through-hole 89 and the area external to the seal 87 is prevented. By applying an under-pressure to the through-holes 89 that is lower than a pressure above the substrate W, the substrate W may be clamped to the substrate holder WT. Alternatively, the seal 87 may have a height slightly shorter than that of the burls 20 so that the seal 87 does not contact the substrate W. Such a seal 87 reduces the gas flow into the through holes 89 so as to give rise to an under-pressure. Optionally, or alternatively, an edge seal 85 may be provided near the periphery of substrate holder WT. Edge seal 85 is a projecting ridge around the outside of substrate holder WT. Edge seal 85 may have a height slightly shorter than that of the burls 20 and reduces the gas flow into the space between the substrate W and substrate holder WT, so as to provide a clamping force.

Other structures, for example to control gas flow and/or thermal conductivity between the substrate holder WT and the substrate W, can be provided. The substrate holder WT can be provided with electronic components. Electronic components may comprise heaters and sensors. Heaters and sensors may be used to control the temperature of the substrate holder WT and substrate W.

Figure 3:
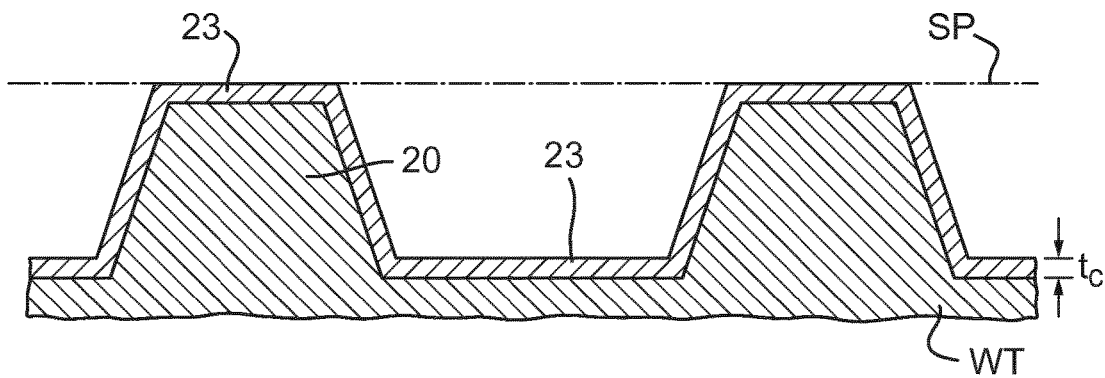
FIG. 3 depicts in cross-section burls of a substrate holder according to an embodiment.

As depicted in FIG. 3, the coating 23 is on the substrate-facing face 41 between the burls 20. The coating 23 has a thickness $t_c$. The coating 23 has a residual stress. For example, the coating 23 may have an internal compressive stress. Alternatively, the coating 23 may have an internal tensile stress.

A burl 20 is shown enlarged in FIG. 3. Burl 20 may have a height $h_b$ in the range of from 10 µm to 500 µm, optionally in the range of from 100 µm to 500 µm, e.g. about 150 µm. The diameter of the distal end surface of burl 20 may be in the range of 100 µm to 300 µm, e.g. about 200 µm. The pitch of the burls 20 may be in the range of about 0.5 mm to 3 mm, e.g. about 1.5 mm. The pitch of the burls 20 is the distance between the centers of two adjacent burls 20. In an embodiment, the total area of the distal end surfaces of all the burls 20 is in the range of from 1% to 3% of the total area of a substrate W or the substrate holder WT. Indicated in FIG. 3, burls 20 may be frustro-conical in shape, with burl side surfaces being slightly inclined. In an embodiment, the burl side surfaces may be vertical or even overhanging. In an embodiment, burls 20 are circular in plan. Burls 20 can also be formed in other shapes if desired.

In an embodiment, the coating 23 comprises a layer of DLC and has a thickness in the range from 0.5 µm to 1.5 µm. A minimum thickness of 0.5 µm allows for the layer of DLC to be processed after deposition, for example to improve the flatness of the top surface of the layer of DLC. Post-processing can ensure that the top surface of the layer of DLC accurately conform to the support plane SP. A minimum thickness of 0.5 µm further allows for any minor local depressions or projections to be levelled out. A maximum thickness of 1.5 µm ensures that the internal compressive stresses in the layer of DLC are kept low. In other embodiments the layer of carbon based material comprises a carbon based material other than DLC and also has a thickness in the range from 0.5 µm to 1.5 µm. This may provide the same advantages as described in relation to DLC.

In an embodiment, the coating 23 is applied by chemical vapor deposition. In an embodiment, the coating 23 is applied by plasma-enhanced chemical vapor deposition.

Embodiments are provided according to the following clauses:

1. A substrate holder for a lithographic apparatus, the substrate holder configured to support a lower surface of a substrate, wherein the substrate holder comprises:
   a main body having a substrate-facing face;
   a plurality of burls protruding from the substrate-facing face, each burl having a distal end configured to engage with the substrate, the distal ends substantially conforming to a support plane and being configured for supporting the substrate; and
   a coating on the substrate-facing face between the burls, the coating having a thickness;
   wherein between the burls the substrate-facing face comprises an arrangement of areas, wherein adjacent areas are separated by a step-change in distance below the support plane, wherein each step-change is greater than the thickness of the coating.
2. The substrate holder of clause 1, wherein adjacent areas are connected by side walls, and any coating on the side walls is insufficient to transfer stress between adjacent areas.
3. A substrate holder for a lithographic apparatus, the substrate holder configured to support a lower surface of a substrate, wherein the substrate holder comprises:
   a main body having a substrate-facing face;
   a plurality of burls protruding from the substrate-facing face, each burl having a distal end configured to engage with the substrate, the distal ends substantially conforming to a support plane and being configured for supporting the substrate; and
   a coating on the substrate-facing face between the burls;
   wherein between the burls the substrate-facing face comprises an arrangement of areas, wherein adjacent areas are separated by a step-change in distance below the support plane, wherein adjacent areas are connected by side walls, and any coating on the side walls is insufficient to transfer stress between adjacent areas.
4. The substrate holder of clause 1, 2 or 3, wherein the coating has a residual stress.
5. The substrate holder of clause 1, 2 or 3, wherein the coating is discontinuous between adjacent areas.
6. The substrate holder of clause 1, 2 or 3, wherein each step-change is at least 1 µm.
7. The substrate holder of clause 1, 2 or 3, wherein the areas have a lateral dimension less than that of the burls.
8. The substrate holder of clause 1, 2 or 3, wherein each step-change is less than a minimum distance between the substrate-facing face of the main body and the support plane.
9. The substrate holder of clause 1, 2 or 3, wherein each area has a lateral dimension greater than the step-changes that separate the area from adjacent areas.
10. The substrate holder of clause 1, 2 or 3, wherein adjacent areas are connected by side walls that extend substantially perpendicularly to the support plane.
11. The substrate holder of clause 1, 2 or 3, wherein each area is arranged to be at one of only two different distances below the support plane.
12. The substrate holder of clause 1, 2 or 3, wherein the arrangement of areas is a grid.
13. A lithographic apparatus comprising:
    a support structure configured to support a patterning device;
    a projection system arranged to project a beam patterned by the patterning device onto a substrate; and
    a substrate holder arranged to hold the substrate, the substrate holder according to any preceding clause.
14. A device manufacturing method using a lithographic apparatus, the method comprising:
    projecting a beam patterned by a patterning device onto a substrate while holding the substrate on a substrate holder, wherein the substrate holder comprises:
    a main body having a substrate-facing face;
    a plurality of burls protruding from the substrate-facing face of the main body, each burl having a distal end configured to engage with the substrate, the distal ends substantially conforming to a support plane and being configured for supporting the substrate; and
    a coating on the substrate-facing face between the burls, the coating having a thickness;
    wherein between the burls the substrate-facing face of the main body comprises an arrangement of areas, wherein adjacent areas are separated by a step-change in distance below the support plane, wherein each step-change is greater than the thickness of the coating.
15. A device manufacturing method using a lithographic apparatus, the method comprising:
    projecting a beam patterned by a patterning device onto a substrate while holding the substrate on a substrate holder, wherein the substrate holder comprises:
    a main body having a substrate-facing face;
    a plurality of burls protruding from the substrate-facing face of the main body, each burl having a distal end configured to engage with the substrate, the distal ends substantially conforming to a support plane and being configured for supporting the substrate; and a coating on the substrate-facing face between the burls;

wherein between the burls the substrate-facing face of the main body comprises an arrangement of areas, wherein adjacent areas are separated by a step-change in distance below the support plane, wherein adjacent areas are connected by side walls, and any coating on the side walls is insufficient to transfer stress between adjacent areas.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

The descriptions above are intended to be illustrative, not limiting. Thus, it will be apparent to one skilled in the art that modifications may be made to the invention as described without departing from the scope of the claims set out below.

The invention claimed is:

1. A substrate holder for a lithographic apparatus, the substrate holder configured to support a lower surface of a substrate, the substrate holder comprising:
a main body having a substrate-facing face when the main body supports the substrate;
a plurality of burls protruding from the substrate-facing face, each burl having a distal end configured to engage with the substrate, the distal ends substantially conforming to a support plane and configured to support the substrate; and
a coating on the substrate-facing face between the burls, wherein between the burls the substrate-facing face comprises an arrangement of areas,
wherein adjacent areas are separated by a step-change in distance below the support plane,
wherein each step-change is greater than a thickness of the coating, and wherein a first area of the adjacent areas nearer to the support plane does not overlap a layer of the coating on a second area of the adjacent areas further from the support plane than the first area.

2. The substrate holder of claim 1, wherein adjacent areas are connected by one or more side walls, and any coating on the one or more side walls is insufficient to transfer stress between adjacent areas.

3. The substrate holder of claim 1, wherein each area has a lateral dimension greater than the step-changes that separate that area from adjacent areas.

4. The substrate holder of claim 1, wherein adjacent areas are connected by one or more side walls that extend substantially perpendicularly to the support plane.

5. The substrate holder of claim 1, wherein each area is arranged to be at one of only two different distances below the support plane.

6. The substrate holder of claim 1, wherein the arrangement of areas is a grid.

7. A lithographic apparatus comprising:
a support structure configured to support a patterning device;
a projection system arranged to project a beam patterned by the patterning device onto a substrate; and
the substrate holder according to claim 1 arranged to hold the substrate.

8. The substrate holder of claim 1, wherein the coating has a residual stress.

9. The substrate holder of claim 1, wherein the coating is discontinuous between adjacent areas.

10. The substrate holder of claim 1, wherein each step-change is at least 1 µm.

11. The substrate holder of claim 1, wherein the areas have a lateral dimension less than that of the burls.

12. The substrate holder of claim 1, wherein each step-change is less than a minimum distance between the substrate-facing face of the main body and the support plane.

13. A substrate holder for a lithographic apparatus, the substrate holder configured to support a lower surface of a substrate, the substrate holder comprising:
a main body having a substrate-facing face when the main body supports the substrate;
a plurality of burls protruding from the substrate-facing face, each burl having a distal end configured to engage with the substrate, the distal ends substantially conforming to a support plane and configured to support the substrate; and a coating on the substrate-facing face between the burls, wherein between the burls the substrate-facing face comprises an arrangement of areas,
wherein adjacent areas are separated by a step-change in distance below the support plane,
wherein adjacent areas are connected by one or more side walls,
wherein a first area of the adjacent areas nearer to the support plane does not overlap a layer of the coating on a second area of the adjacent areas further from the support plane than the first area, and wherein any coating on the one or more side walls is insufficient to transfer stress between adjacent areas.

14. The substrate holder of claim 13, wherein the coating has a residual stress.

15. The substrate holder of claim 13, wherein the coating is discontinuous between adjacent areas.

16. The substrate holder of claim 13, wherein each step-change is at least 1 µm.

17. The substrate holder of claim 13, wherein the areas have a lateral dimension less than that of the burls.

18. The substrate holder of claim 13, wherein each step-change is less than a minimum distance between the substrate-facing face of the main body and the support plane.

19. A device manufacturing method using a lithographic apparatus, the method comprising:

projecting a beam patterned by a patterning device onto a substrate while holding the substrate on a substrate holder, wherein the substrate holder comprises: a main body having a substrate-facing face;

a plurality of burls protruding from the substrate-facing face of the main body, each burl having a distal end engaging with the substrate, the distal ends substantially conforming to a support plane and supporting the substrate; and a coating on the substrate-facing face between the burls, wherein between the burls the substrate-facing face of the main body comprises an arrangement of areas, wherein adjacent areas are separated by a step-change in distance below the support plane, wherein each step-change is greater than a thickness of the coating, and wherein a first area of the adjacent areas nearer to the support plane does not overlap a layer of the coating on a second area of the adjacent areas further from the support plane than the first area.

20. A device manufacturing method using a lithographic apparatus, the method comprising:

projecting a beam patterned by a patterning device onto a substrate while holding the substrate on a substrate holder, wherein the substrate holder comprises: a main body having a substrate-facing face;

a plurality of burls protruding from the substrate-facing face of the main body, each burl having a distal end engaging with the substrate, the distal ends substantially conforming to a support plane and supporting the substrate; and a coating on the substrate-facing face between the burls, wherein between the burls the substrate-facing face of the main body comprises an arrangement of areas, wherein adjacent areas are separated by a step-change in distance below the support plane, wherein adjacent areas are connected by one or more side walls, wherein a first area of the adjacent areas nearer to the support plane does not overlap a layer of the coating on a second area of the adjacent areas further from the support plane than the first area, and wherein any coating on the one or more side walls is insufficient to transfer stress between adjacent areas.

\* \* \* \* \*